United States Patent
Polesel et al.

(10) Patent No.: US 10,116,267 B2
(45) Date of Patent: Oct. 30, 2018

(54) SINGLE-ENDED AMPLIFIER CIRCUIT WITH IMPROVED CHOPPER CONFIGURATION

(71) Applicant: STMicroelectronics S.r.l., Agrate Brianza (IT)

(72) Inventors: Stefano Polesel, Treviso (IT); Germano Nicollini, Piacenza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 15/603,004

(22) Filed: May 23, 2017

(65) Prior Publication Data
US 2018/0123524 A1    May 3, 2018

(30) Foreign Application Priority Data
Nov. 2, 2016    (IT) .......................... 102016000110064

(51) Int. Cl.
H03F 3/45    (2006.01)
H03F 1/26    (2006.01)
H03F 3/393    (2006.01)
H03F 3/387    (2006.01)

(52) U.S. Cl.
CPC .............. *H03F 1/26* (2013.01); *H03F 3/387* (2013.01); *H03F 3/393* (2013.01); *H03F 3/4521* (2013.01); *H03F 3/45183* (2013.01); *H03F 3/45475* (2013.01); *H03F 3/45775* (2013.01); *H03F 2200/271* (2013.01); *H03F 2200/453* (2013.01); *H03F 2200/456* (2013.01);
(Continued)

(58) Field of Classification Search
CPC .......................................................... H03F 3/45
USPC ...................................................... 330/9, 252
See application file for complete search history.

(56) References Cited

U.S. PATENT DOCUMENTS 9,473,088 B2 * 10/2016 Funato .................... H03F 3/393
2013/0335131 A1 * 12/2013 Ceballos .................. G06G 7/18
327/337

(Continued)

OTHER PUBLICATIONS

Ong et al., "A Power-Aware Chopper-Stabilized Instrumentation Amplifier for Resistive Wheatstone Bridge Sensors," *IEEE Transactions on Instrumentation and Measurement* 63(9):2253-2263, Sep. 2014.
(Continued)

*Primary Examiner* — Henry Choe
(74) *Attorney, Agent, or Firm* — Seed IP Law Group LLP

(57) ABSTRACT

An amplifier circuit a differential input stage coupled to a first input and to a second input between which a differential input voltage is present. A converter stage is coupled to the input stage to convert the differential input voltage into a converted voltage. An output stage is coupled to the converter stage and generates, starting from the converted voltage, an output voltage on a single output of the amplifier circuit. A biasing stage is coupled to the input stage and to the output stage to supply a biasing current. A chopper module reduces a contribution of offset and noise associated with the output voltage. The chopper module is coupled to the input stage, converter stage, and to the biasing stage. The chopper module includes an input chopper stage, a converter chopper stage, and a biasing chopper stage that operate jointly under control of a chopper signal.

20 Claims, 4 Drawing Sheets

(52) U.S. Cl.
CPC .............. *H03F 2203/45212* (2013.01); *H03F 2203/45644* (2013.01); *H03F 2203/45692* (2013.01)

(56) References Cited

U.S. PATENT DOCUMENTS

2015/0326193 A1    11/2015  Maurino
2015/0357979 A1*   12/2015  Ouchi ................ H03F 3/45192
                                                               330/9

OTHER PUBLICATIONS

Yang et al., "Low Power Chopper Amplifier without LPF," IEEE Asia Pacific Conference on Circuits and Systems (APCCAS), Kuala Lumpur, Malaysia, Dec. 6-9, 2010, pp. 17-19.

Bakker et al., "A CMOS Nested-Chopper Instrumentation Amplifier with 100-nV Offset," *IEEE Journal of Solid-State Circuits* 35(12):1877-1883, Dec. 2000.

Enz et al., "Circuit Techniques for Reducing the Effects of Op-Amp Imperfections: Autozeroing, Correlated Double Sampling, and Chopper Stabilization," *Proceedings of the IEEE* 84(11):1584-1614, Nov. 1996.

Sanduleanu et al., "A Low Noise, Low Residual Offset, Chopped Amplifier for Mixed Level Applications," IEEE International Conference on Electronics, Circuits, and Systems, Sep. 7-10, 1998, Lisboa, Portugal, 5 pages.

* cited by examiner

SINGLE-ENDED AMPLIFIER CIRCUIT WITH IMPROVED CHOPPER CONFIGURATION

BACKGROUND

Technical Field

The present disclosure relates to a single-ended amplifier circuit with improved chopper configuration.

Description of the Related Art

As it is known, the chopping technique is used in amplifiers circuits, in particular in operational-amplifier circuits with MOS transistors (to which the present discussion will make specific reference), in order to reduce flicker noise and offset.

This technique is, for example, described in:

C. C. Enz, G. C. Temes, "Circuit techniques for reducing the effects of op amp imperfections: Autozeroing, correlated double-sampling, and chopper stabilization", Proc. IEEE, November 1996.

In general, and as shown schematically in FIG. 1, the chopping technique envisages introduction of a first chopper stage 2, at the differential input terminals of an operational-amplifier stage 1, between which an input voltage $V_{in}$ is present, and a second chopper stage 3, at the differential output terminals of the operational-amplifier stage 1, between which an output voltage $V_{out}$ is present. The operational-amplifier stage 1 has, in the example, a fully differential configuration.

Each chopper stage 2, 3 is implemented by controlled switches (in turn implemented, for example, by means of MOS transistors), which selectively and alternately couple the inputs and the outputs of the same chopper stage 2, 3. These switches are controlled by a control signal $S_c$.

In detail, and as shown in FIG. 2, each chopper stage 2, 3 has a first input $IN_1$ and a second input $IN_2$ and a first output $OUT_1$ and a second output $OUT_2$, and includes a first switch element 5a, controlled by the control signal $S_c$ (for example, a square-wave periodic signal, having a switching frequency $f_c$), and a second switch element 5b, controlled by the same control signal $S_c$.

The first switch element 5a is controlled to connect the first input $IN_1$ to the first output $OUT_1$, in a first phase of the control signal $S_c$ (which corresponds to a first interval of the switching period, in which the same signal has, for example, a high value), and to connect the first input $IN_1$ to the second output $OUT_2$, in the second phase of the control signal $S_c$ (which corresponds to the second interval of the switching period, in which the signal has, in the example, a low value).

The second switch element 5b is controlled by the same control signal $S_c$ to connect the second input $IN_2$ to the second output $OUT_2$, in the first phase of the control signal $S_c$, and to connect the second input $IN_2$ to the first output $OUT_1$, in the second phase of the control signal $S_c$.

Operation of each chopper stage 2, 3 hence envisages that: during the first phase of the control signal $S_c$, the first input $IN_1$ is connected to the first output $OUT_1$ and the second input $IN_2$ is connected to the second output $OUT_2$; and during the second phase of the control signal $S_c$, the first input $IN_1$ is instead connected to the second output $OUT_2$ and the second input $IN_2$ is instead connected to the first output $OUT_1$.

The chopper stage in this way determines a modulation of the signal received at the input, around the switching frequency $f_c$ of the control signal $S_c$.

In the operational-amplifier stage 1, the first and second chopper stages 2, 3 provide a respective modulator stage, at the frequency of the control signal $S_c$, at the input and, respectively, at the output of the operational-amplifier stage.

In particular, the input signal $V_{in}$ is in this way modulated twice for generation of the output signal $V_{out}$ so that any shift in frequency between the input and output signals $V_{in}$, $V_{out}$ does not occur. Instead, the flicker noise and the offset generated within the operational-amplifier stage 1 are modulated only once, by the second chopper stage 3, to be shifted in frequency around the switching frequency $f_c$ of the control signal $S_c$, so that they can hence be removed via filtering, for example a low-pass filtering.

The chopping technique can, for its intrinsic symmetrical nature, be applied directly to fully differential (or balanced) amplifier configurations, in which both the inputs and the outputs have a differential configuration.

In the case of single-ended amplifiers, namely, having differential inputs and a single output, the chopping technique is instead difficult to implement.

Known solutions that have been proposed envisage in this case once again the use of a first chopper stage, at the differential inputs of the operational amplifier, whereas a second chopper stage is inserted within the operational-amplifier stage, in a given position along the path of the differential signal, in any case before the conversion from differential to the single-ended output is carried out.

Solutions of this kind are described, for example, in:

M. A. T. Sanduleanu, et al. "A low noise, low residual offset, chopped amplifier for mixed level applications", IEEE International Conference on Electronics, Circuits and Systems, 1998; and A. Bakker, et al. "A CMOS Nested-Chopper Instrumentation Amplifier with 100 nV Offset", IEEE JSSC, December 2000.

A problem with this implementation lies, however, in the fact that the chopping action does not affect in this case the flicker noise and offset generated by the transistors of the stages of the operational amplifier that are not associated with the aforesaid second chopper stage (because they are set downstream of the same second chopper stage, along the path of the signal).

Consequently, the flicker noise and the offset generated by the transistors of the above subsequent stages may constitute a determining limitation for the overall reduction of noise of the entire operational-amplifier circuit, not allowing, for example, its use in low-consumption and low-noise applications.

BRIEF SUMMARY

The aim of the present disclosure is to solve, at least in part, the problems highlighted previously in order to provide an improved solution for use of the chopping technique in a single-ended amplifier circuit.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein:

FIG. 3b shows the plot of a control signal in the amplifier circuit of FIG. 3a;

DETAILED DESCRIPTION

As will be highlighted hereinafter, one embodiment of the present disclosure generally envisages introduction within the amplifier circuit, along the entire path of the signal, of a suitable number of chopper stages, co-operating with one another to jointly reduce the effects of flicker noise and offset at the output.

Figure 3A:
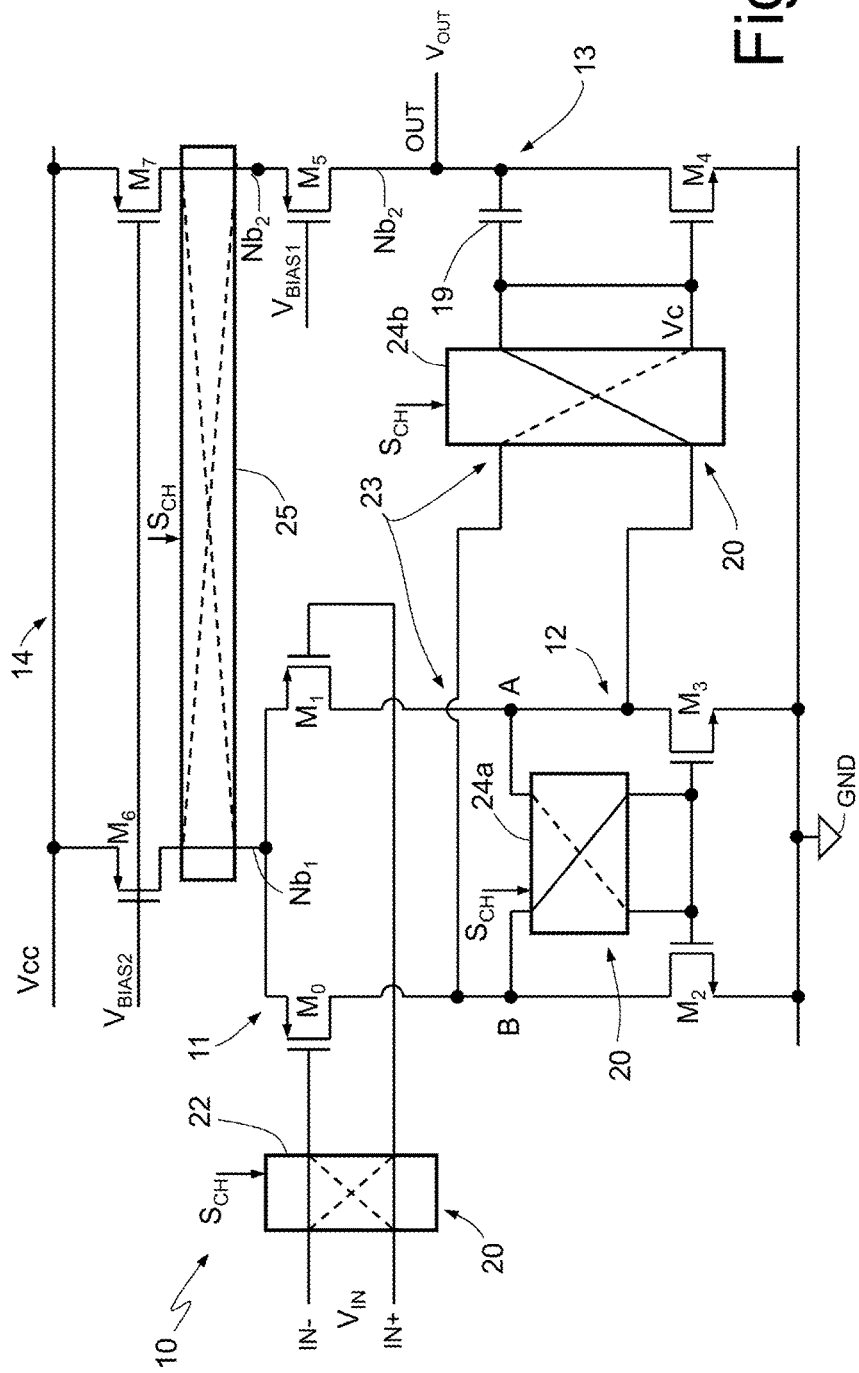
FIG. 3a shows an amplifier circuit with chopper configuration according to one embodiment of the present disclosure.

FIG. 3a shows an amplifier circuit designated as a whole by 10, provided with: an input stage 11, of a differential type; a converter stage 12, designed to carry out conversion from differential to single-ended; an output stage 13, of a single-ended type; and a biasing stage 14.

The amplifier circuit 10 has a first differential input and a second differential input, designated by IN_ and IN_+, respectively, and a single output OUT.

The input stage 11 includes a pair of MOS transistors, in particular of a PMOS type, formed by a first input transistor $M_0$ and by a second input transistor $M_1$.

The first input transistor $M_0$ has a gate terminal designed to be selectively coupled to the first input terminal IN_, or alternatively, to the second input terminal IN_+ with a chopping technique, as described in detail hereinafter; a source terminal connected to a first biasing node $N_{b1}$; and a drain terminal connected to an internal node B. The second input transistor $M_1$ has a gate terminal designed to be selectively coupled to the second input terminal IN_+, or alternatively to the first input terminal IN_, with a chopping technique, as described in detail hereinafter; a source terminal connected to the above first biasing node $N_{b1}$; and a drain terminal connected to a further internal node A.

The converter stage 12 includes a respective pair of MOS transistors, in particular of an NMOS type, formed by a first conversion transistor $M_2$ and a second conversion transistor $M_3$, having gate terminals connected together, and source terminals connected to a reference terminal (for example, to the ground GND of the amplifier circuit 10).

The first conversion transistor M2 moreover has its drain terminal connected to the internal node B, and the second conversion transistor M3 has its drain terminal connected to the internal node A.

In particular, the gate terminals of the conversion transistors are designed to be selectively coupled to the internal node B, or alternatively to the internal node A, with a chopping technique, as described in detail hereinafter.

The output stage 13 includes a first output transistor $M_4$, of an NMOS type, and a second output transistor $M_5$, of a PMOS type.

The first output transistor $M_4$ has a gate terminal designed to be selectively coupled to the internal node A, or alternatively to the internal node B, with a chopping technique, as described in detail hereinafter; a source terminal connected to the reference terminal GND; and a drain terminal connected to the output OUT of the amplifier circuit 10.

The second output transistor $M_5$ has a gate terminal receiving a first biasing voltage $V_{bias1}$, in particular having a value substantially equal to the biasing component of the input voltage $V_{in}$; a source terminal connected to a second biasing node $N_{b2}$; and a drain terminal connected to the output OUT of the amplifier circuit 10.

The biasing stage 14 includes a pair of MOS transistors, in particular of a PMOS type, formed by a first biasing transistor $M_6$ and a second biasing transistor $M_7$, having gate terminals that are connected together and receive a second biasing voltage $V_{bias2}$, and source terminals that are also connected together and to a supply line of the amplifier circuit 10, which receives a supply voltage $V_{CC}$.

The first biasing transistor $M_6$ has its drain terminal designed to be selectively coupled to the first biasing node $N_{b1}$, or alternatively to the second biasing node $N_{b2}$, with a chopping technique; likewise, the second biasing transistor $M_7$ has its drain terminal designed to be selectively coupled to the second biasing node $N_{b2}$, or alternatively to the first biasing node $N_{b1}$, with a chopping technique.

The amplifier circuit 10 further includes a capacitor element 19 connected between the gate terminal of the first output transistor $M_4$ and the output OUT of the same amplifier circuit 10.

According to one embodiment of the present disclosure, the amplifier circuit 10 further includes a chopper module 20 including an input chopper stage 22, a converter chopper stage 23, and a biasing chopper stage 25.

The input chopper stage 22 has a first input and a second input, connected respectively to the first differential input IN_ and to the second differential input IN_+, and a first output and a second output, connected to the gate terminals of the first and second input transistors $M_0$, $M_1$, respectively. The input chopper stage 22 is controlled by a chopper signal $S_{CH}$ (for example, a square-wave periodic signal, as shown in FIG. 3b, having a chopper frequency $f_{CH}$).

Figure 1:
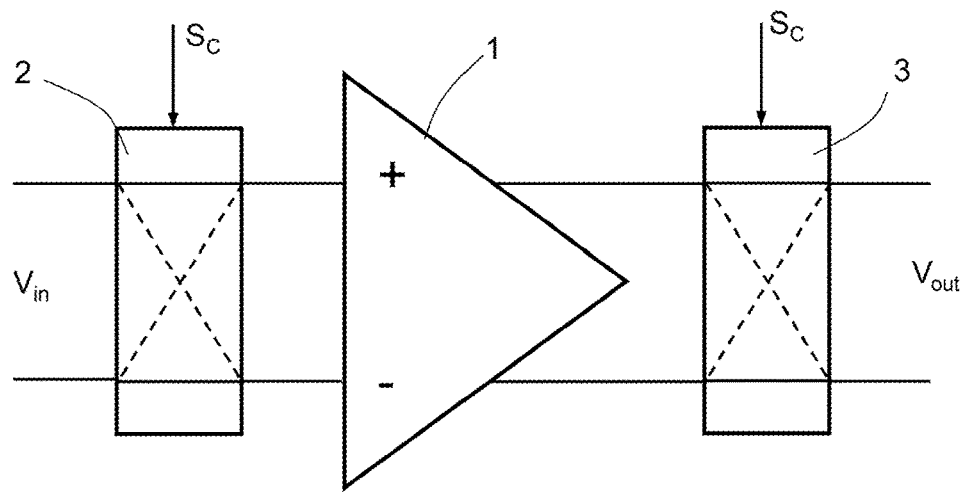
FIG. 1 shows a general block diagram of a fully differential amplifier circuit with chopper configuration, of a known type.
Figure 2:
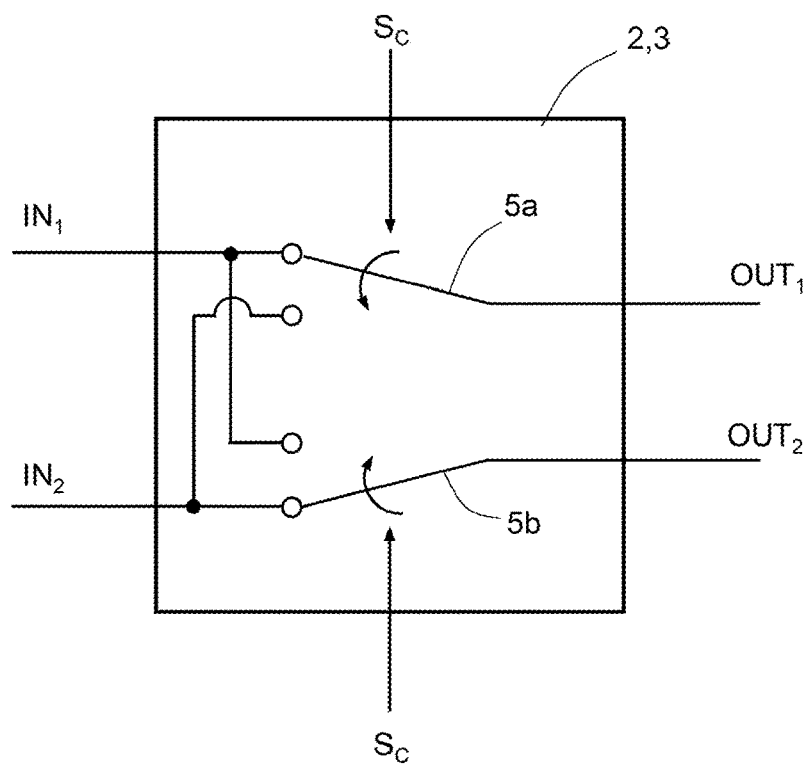
FIG. 2 shows in detail the configuration of a chopper stage in the amplifier circuit of FIG. 1.

The input chopper stage 22 internally includes appropriate switch elements (as will be understood to a person skilled in the art, and in a way substantially similar to what has been described with reference to FIG. 2), so as to operate as follows: connect the first input to the first output in a first phase $\varphi_1$ of the chopper signal $S_{CH}$, and to the second output in the second phase $\varphi_2$ of the chopper signal $S_{CH}$; and moreover to connect the second input to the second output in the same first phase $\varphi_1$ of the chopper signal $S_{CH}$, and to the first output in the same second phase $\varphi_2$ of the chopper signal $S_{CH}$.

Figure 3B:
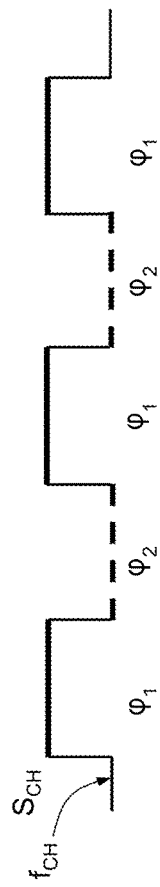

It should be noted that in FIG. 3a the connections selectively provided internally by the chopper stages are represented with a solid line when referred to the first phase of the chopper signal $S_{CH}$ (which is also represented with a solid line in FIG. 3b), and with a dashed line when referred to the second phase $\varphi_2$ of the same chopper signal $S_{CH}$ (which is also represented with a dashed line in FIG. 3b).

The converter chopper stage 23 includes a first chopper unit 24a and a second chopper unit 24b.

In detail, the first chopper unit 24a has a first input and a second input, connected respectively to the internal nodes B and A, and a first output and a second output both connected to the gate terminal in common of the first conversion transistor $M_2$ and of the second conversion transistor $M_3$.

The first chopper unit 24a is controlled by the same chopper signal $S_{CH}$ and is internally configured to connect the first input to the second output in the first phase $\varphi_1$ of the chopper signal $S_{CH}$, and for alternately connecting the second input to the first output in the second phase $\varphi_2$ of the chopper signal $S_{CH}$.

As it is clear, and is here not shown in detail, the first chopper unit 24a hence includes in this case a first switch element connected between the first input and the second output and controlled by the chopper signal $S_{CH}$ (in particular, driven into a closed state by the first phase $\varphi_1$ of the chopper signal $S_{CH}$, and into an open state by the second phase $\varphi_2$ of the chopper signal $S_{CH}$); and a second switch element connected between the second input and the first output and controlled by the same chopper signal $S_{CH}$ (in particular, driven into a closed state by the second phase $\varphi_2$ of the chopper signal $S_{CH}$, and into an open state by the first phase $\varphi_1$ of the same chopper signal $S_{CH}$).

The second chopper unit 24b of the converter chopper stage 23 in turn has a first input and a second input, connected, respectively, to the internal nodes A and B, and a first output and a second output, both connected to the gate terminal of the first output transistor $M_4$.

The second chopper unit 24b (in a way similar to the first chopper unit 24a of the converter chopper stage 23, substantially having the same configuration) is controlled by the chopper signal $S_{CH}$ and is internally configured to connect the first input to the second output in the first phase $\varphi_1$ of the chopper signal $S_{CH}$, and for alternately connecting the second input to the first output in the second phase $\varphi_2$ of the chopper signal $S_{CH}$.

The biasing chopper stage 25 has a first input and a second input, connected, respectively, to the drain terminal of the first biasing transistor $M_6$ and to the drain terminal of the second biasing transistor $M_7$, and a first output and a second output, connected, respectively, to the first biasing node $N_{b1}$ and to the second biasing node $N_{b2}$; also the biasing chopper stage 25 is controlled by the chopper signal $S_{CH}$.

The biasing chopper stage 25 internally includes appropriate switch elements (as will be evident to a person skilled in the field, and in a way substantially similar to what has been described for the input chopper stage 22) so as to operate as follows: to connect the first input to the first output in the first phase $\varphi_1$ of the chopper signal $S_{CH}$, and to the second output in the second phase $\varphi_2$ of the chopper signal $S_{CH}$; and moreover to connect the second input to the second output in the same first phase $\varphi_1$ of the chopper signal $S_{CH}$, and to the first output in the same second phase $\varphi_2$ of the chopper signal $S_{CH}$.

Operation of the amplifier circuit 10 will now be described, with particular reference to the operation of the aforesaid chopper module 20.

In general, as will be understood to a person skilled in the art, the amplifier circuit 10 is configured so as to amplify appropriately the input voltage $V_{in}$ received between the input terminals $IN_-$, $IN_+$, carrying out a conversion from differential to single-ended for generation of the output voltage $V_{out}$.

The input stage 11, as a function of the voltage difference between the input terminals $IN_-$, $IN_+$, generates a differential unbalancing current, which is converted into a single-ended voltage by the converter stage 12, which provides a current mirror. This voltage is then amplified appropriately by the first output transistor $M_4$ for generation of the output voltage $V_{out}$.

The first and second biasing transistors $M_6$, $M_7$ are designed to generate the biasing currents required for operation of the input stage 11 and of the output stage 13.

The capacitor element 19 moreover ensures frequency stability of the amplifier circuit 10, when operating in feedback mode, and in particular to establish in an appropriate way the frequencies of the zeros and poles of the same amplifier circuit 10 (as will be clear to a person skilled in the field).

In particular, operation of the input chopper stage 22 is of a substantially standard type, enabling in fact modulation of the input voltage $V_{in}$, thus carrying out a translation in frequency at the chopper frequency $f_{CH}$.

The first and second chopper units 24a, 24b of the converter chopper stage 23 jointly operate so that the converter stage 12 operates as described below.

During the first phase $\varphi_1$ of the chopper signal $S_{CH}$, the first conversion transistor $M_2$ is diode-connected (i.e., the corresponding gate terminal is connected to the drain terminal) and operates, jointly with the second conversion transistor $M_3$, for carrying out the differential to single-ended conversion operation, generating a single-ended converted voltage, designated by $V_c$, on the internal node A. During the same first phase $\varphi_1$, the internal node A is connected to the gate terminal of the first output transistor $M_4$, which appropriately amplifies the converted voltage $V_c$ to generate the output voltage $V_{out}$.

Likewise, during the second phase $\varphi_2$ of the chopper signal $S_{CH}$, the second conversion transistor $M_3$ is diode-connected (i.e., the corresponding gate terminal is connected to the drain terminal) and operates, jointly with the first conversion transistor $M_2$, to carry out the differential to single-ended conversion operation to generate the converted voltage $V_c$, this time on the internal node B; during the same second phase $\varphi_2$, the internal node B is connected to the gate terminal of the first output transistor $M_4$, which again amplifies the converted voltage $V_c$ to generate the output voltage $V_{out}$.

The converter chopper stage 23 hence demodulates the differential input signal (which had been previously modulated) bringing it down to baseband, and at the same time modulates the offset and the flicker noise of the transistors of the input stage 11 (first and second input transistors $M_0$, $M_1$) and of the converter stage 12 (first and second conversion transistors $M_2$, $M_3$) around the chopper frequency $f_{CH}$. As mentioned previously, the contributions of offset and noise, thus modulated, can then be removed via suitable filtering, for example of a low-pass type.

The biasing chopper stage 25 operates so as to further reduce, and render substantially negligible, the effect at the output of the offset and flicker noise of the transistors of the biasing stage 14 (first and second biasing transistors $M_6$, $M_7$).

The chopping action implemented by the biasing chopper stage 25 is such that the low-frequency gains of the flicker noise of the first and second biasing transistors $M_6$, $M_7$ have opposite sign so that the noise contributions at the output are compensated.

The second output transistor $M_5$ operates to maintain substantially the same drain-to-source voltage drop ($V_{DS}$) for the first and second biasing transistors $M_6$, $M_7$ when they operate according to the chopping mode, preventing discharge of the corresponding drain capacitances.

In particular, it is advantageous to size appropriately the aforesaid biasing transistors $M_6$, $M_7$ with respect to the other transistors of the amplifier circuit 10, in such a way that the contributions of noise substantially cancel out, so as to set substantially to zero the effect of flicker noise due to the same transistors.

In this regard, it may be shown that the low-frequency gain for the flicker noise of the first biasing transistor $M_6$, designated by $g_1$, is given by the following expression:

$$g_1 = \frac{g_{m6}}{2 \cdot g_{m2,3}} \cdot (g_{m4} \cdot r_{o4})$$

where $g_{m6}$ is the transconductance of the first biasing transistor $M_6$, $g_{m2,3}$ is the transconductance of the first and second conversion transistors $M_2$, $M_3$, $g_{m4}$ is the transconductance of the first output transistor $M_4$, and $r_{o4}$ is the resistance of the same first output transistor $M_4$.

Likewise, it may be shown that the low-frequency gain for the flicker noise of the second biasing transistor $M_7$, designated by $g_2$, is given by the following expression:

$$g_2 = (g_{m7} \cdot r_{o4})$$

where $g_{m7}$ is the transconductance of the second biasing transistor $M_7$.

Equating the aforesaid low-frequency gains $g_1$, $g_2$, it is hence possible to eliminate substantially the flicker noise at the output thanks to the biasing chopper stage 25. In particular, the following relation has to be satisfied:

$$\frac{g_{m6}}{2 \cdot g_{m2,3}} \cdot g_{m4} = g_{m7}$$

For this purpose, it is possible to size the first and second biasing transistors $M_6$, $M_7$ so that they have values of width (W) and length (L) of the corresponding channels that are substantially the same, so that the relation $g_{m6} = g_{m7}$ applies. Moreover, in the example, the first output transistor $M_4$ may be sized to have the same value of length (L) and a width (W) that is twice that of the first and second conversion transistors $M_2$, $M_3$ (so that the relation $g_{m4} = 2 \cdot g_{m2,3}$ applies).

It will, however, be clear to a person skilled in the art that other designs of the aforesaid transistors may be identified allowing to obtain the desired output gain ratios and substantial zeroing of the output flicker noise, thanks to the biasing chopper stage 25.

The advantages of the amplifier circuit 10 emerge clearly from the foregoing description.

In any case, it is again emphasized that the embodiments described enable considerable reduction of the limitations linked to the residual offset and noise in single-ended circuits amplifiers.

Figure 4A:
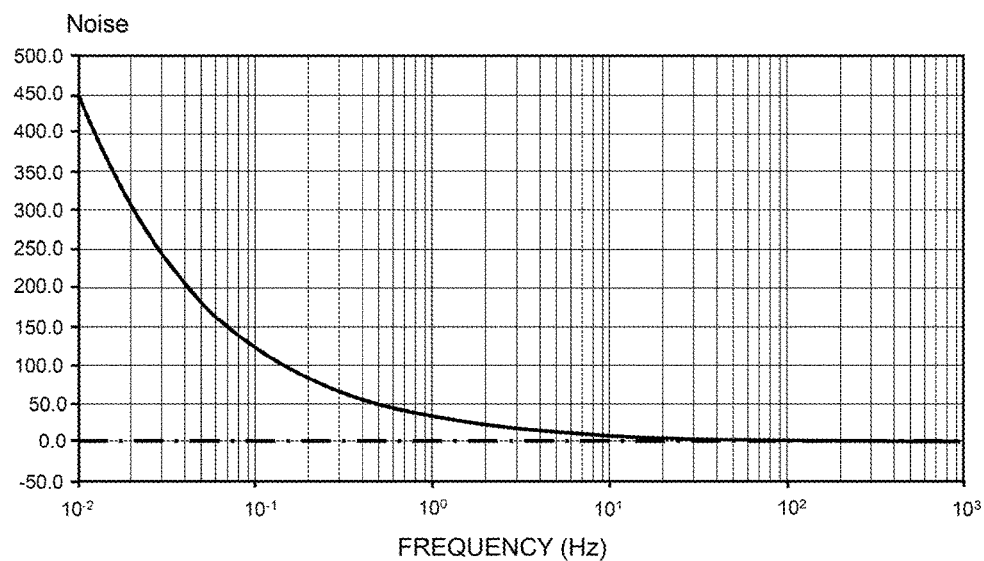
FIGS. 4a and 4b show plots of electrical quantities related to the amplifier circuit of FIG. 3a compared with an amplifier circuit of a known type.
Figure 4B:
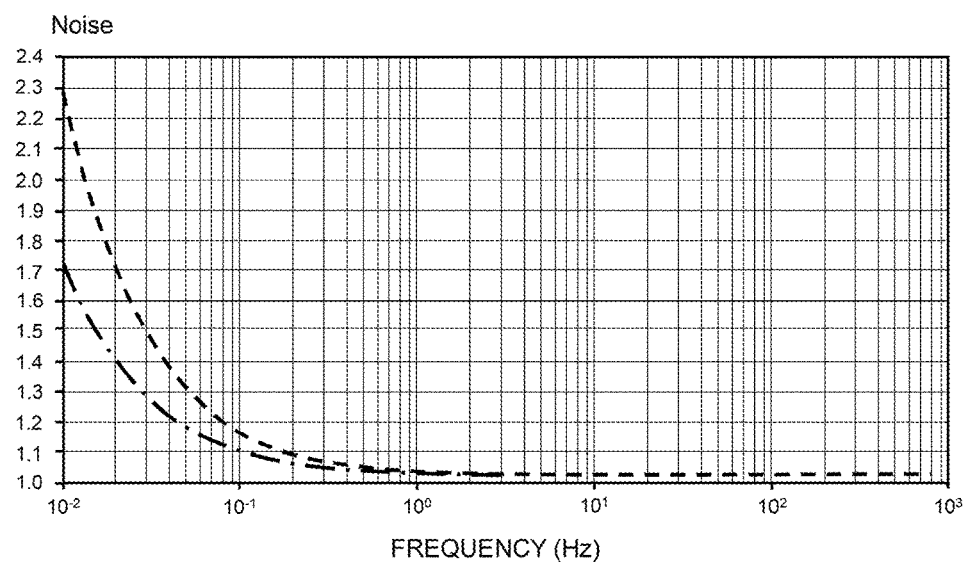

In this regard, FIGS. 4a and 4b (the latter being at an enlarged scale) show the plots of the flicker noise as a function of frequency, for an amplifier circuit according to the known art (solid line) and for the amplifier circuit 10 of FIG. 3a, in the case where the action of just the input and converter chopper stages 22, 23 is considered (dashed line), and in the case where the further action of the biasing chopper stage 25 is considered (dashed-and-dotted line).

There may immediately be noted the considerable reduction of residual noise, thanks to the presence of the chopper module 20, and in particular of the converter chopper stage 23, which operates associated with the converter stage 12 for generation of the single-ended voltage to be supplied at the output (instead of operating along the differential path that precedes the same converter stage, as in known solutions). The residual output noise is even lower, in effect negligible, in the case where the chopper module 20 according to the present disclosure also includes the biasing chopper stage 25.

It is moreover emphasized that the embodiments described have very simple implementations, requiring a minimum occupation of area, and do not involve an increase in power consumption as compared to traditional solutions.

Moreover, the sizing possibly required for the biasing transistors, in order to further reduce the offset and noise, may be normally obtained during sizing and design using CMOS transistors.

Finally, it is clear that modifications and variations may be made to what has been described and illustrated herein, without thereby departing from the scope of the present disclosure.

In particular, it is highlighted that the configuration of the amplifier circuit 10 may differ from the one illustrated and described in FIG. 3A.

For example, the amplifier circuit 10 may have a different circuit configuration for one or more of the input stage 11, the converter stage 12, the output stage 13, and the biasing stage 14.

In addition, it is highlighted that the amplifier circuit 10 may possibly include further stages (of a known type), for example gain stages, downstream of the output stage 13.

Also in this case, the embodiments described are advantageous in so far as any possible noise and offset introduced by the subsequent stages is in any case reduced by the gain of the previous stages (in particular, of the input stage 11 and converter stage 12 and of the output stage 13), thus contributing only negligibly to the noise at the output of the amplifier circuit 10.

Figure 5:
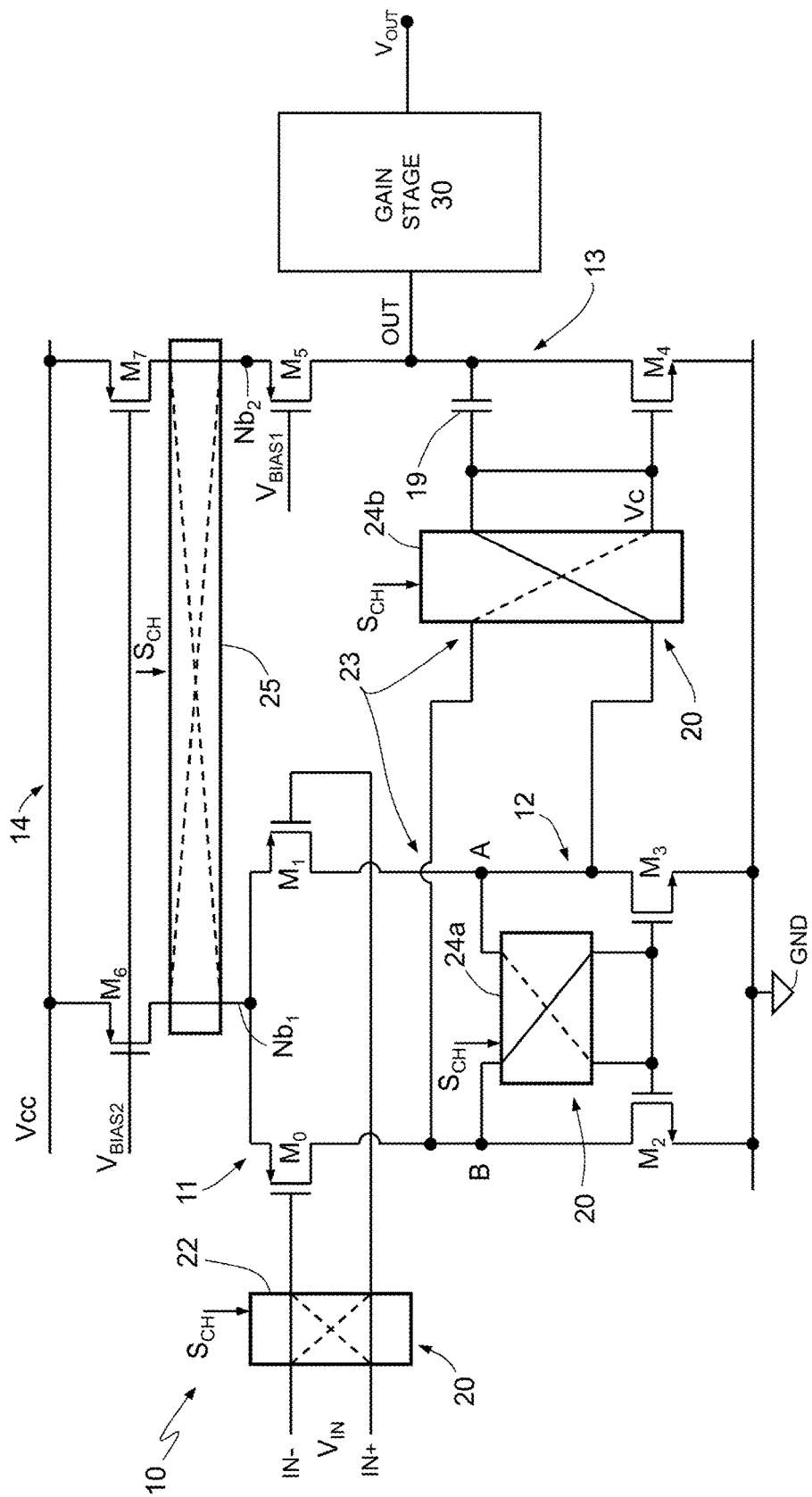
FIG. 5 shows an amplifier circuit with chopper configuration according to a further embodiment of the present disclosure.

By way of example, in this regard, FIG. 5 shows an amplifier circuit, designated once again by 10, in which at least one further gain stage 30 is connected to the output of the output stage 13, contributing to generation of the output voltage $V_{out}$ for the amplifier circuit 10.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An amplifier circuit, comprising:
   an input stage, of a differential type, coupled to a first differential input and to a second differential input between which, in use, a differential input voltage is present;
   a converter stage coupled to said input stage and configured to convert said differential input voltage into a single-ended converted voltage;
   an output stage coupled to said converter stage and configured to generate, starting from said single-ended converted voltage, an output voltage on a single output;
   a biasing stage, operatively coupled to said input stage and to said output stage for supplying a biasing current; and
   a chopper module configured to reduce a contribution of offset and noise associated to said output voltage, wherein said chopper module includes:
      an input chopper stage coupled to said input stage;

a converter chopper stage coupled to said converter stage and configured to generate said single-ended converted voltage; and a biasing chopper stage coupled to said biasing stage and configured to generate said biasing current.

2. The amplifier circuit according to claim 1, wherein said input chopper stage, said converter chopper stage, and said biasing chopper stage operate in combination in response to a chopper signal.

3. The amplifier circuit according to claim 1, wherein said converter stage comprises: a current mirror formed by a first conversion transistor and a second conversion transistor having gate terminals connected together, wherein said first conversion transistor includes a drain terminal connected to a first internal node and said second conversion transistor includes a drain terminal connected to a second internal node.

4. The amplifier circuit of claim 3, wherein said output stage comprises a first output transistor having a drain terminal connected to an output terminal on which said output voltage is present, and a gate terminal configured to receive said single-ended converted voltage.

5. The amplifier circuit of claim 4, wherein said converter chopper stage further comprises a first chopper unit coupled between said first and second internal nodes and said gate terminals of said first and second conversion transistors, and wherein said first chopper unit is configured, responsive to a chopper signal having a first phase, to couple said first internal node to said gate terminals of said first and second conversion transistors and is configured, responsive to the chopper signal having a second phase, to couple said second internal node to said gate terminals of said first and second conversion transistors.

6. The amplifier circuit of claim 5, wherein said converter chopper stage further comprises a second chopper unit coupled between said first and second internal nodes and said gate terminal of said first output transistor, and wherein said second chopper unit is configured, responsive to the chopper signal having the first phase, to couple said second internal node to said gate terminal of said first output transistor, and is configured, responsive to the chopper signal having the second phase, to couple said first internal node to said gate terminal of said first output transistor.

7. The amplifier circuit of claim 6, wherein said biasing stage comprises a first biasing transistor and a second biasing transistor having gate terminals coupled together, and wherein said biasing chopper stage is coupled between the drain terminals of said first biasing transistor and said second biasing transistor and a first biasing node and a second biasing node, and wherein said biasing chopper stage is configured, responsive to the chopper signal having the first phase to couple said first biasing node and said second biasing node to said drain terminals of said first biasing transistor and said second biasing transistor, respectively, and is configured, responsive to the chopper signal having the second phase, to couple said first biasing node and said second biasing node to said drain terminals of said second biasing transistor and said first biasing transistor, respectively.

8. The amplifier circuit of claim 7, wherein said first biasing transistor has a transconductance $g_{m6}$, said first and second conversion transistors have a transconductance of $g_{m2,3}$, said first output transistor has a transconductance of $g_{m4}$, and said second biasing transistor has a transconductance of $g_{m7}$, and wherein the relation among these transconductances is as follows:

$$\frac{g_{m6}}{2 \cdot g_{m2,3}} \cdot g_{m4} = g_{m7}.$$

9. The amplifier circuit of claim 8, wherein said first and second biasing transistors are sized to have a same value of length and a same value of width, and wherein said first output transistor is sized to have a same value of length and a value of width that is twice a width of said first and second conversion transistors.

10. The amplifier circuit of claim 7, wherein said input stage comprises a first input transistor and a second input transistor the first and second input transistors having respective source terminals connected together at the first biasing node and having respective drain terminals connected to said first internal node and said second internal node, respectively and wherein said input chopper stage is coupled between gate terminals of said first input transistor and second input transistor and said first differential input and second differential input, the input chopper stage configured, responsive to the chopper signal having the first phase, to couple said first differential input and second differential input to said gate terminals of said first input transistor and second input transistor, respectively, and configured, responsive to the chopper signal having the second phase, to couple said first differential input and second differential input to said gate terminals of said second input transistor and said first input transistor, respectively.

11. The amplifier circuit of claim 10 further comprising:
a capacitor element coupled between the gate terminal and the drain terminal of said first output transistor; and
a second output transistor connected to said drain terminal of said first output transistor and configured receive, on a gate terminal, a biasing voltage having a value substantially equal to a biasing component of said input voltage.

12. An amplifier circuit, comprising:
a first differential input and a second differential input configured to receive a differential input voltage across the first and second differential inputs;
an input chopper stage circuit configured to receive a chopper signal, the input chopper stage circuit having first and second inputs coupled to the first and second differential inputs, respectively, and having first and second input chopper stage outputs, the input chopper stage circuit configured to generate a switched differential voltage across the first and second input chopper stage outputs responsive to the chopper signal;
a converter stage circuit coupled to the first and second input chopper stage outputs and configured to receive the chopper signal, the converter stage circuit configured to generate, responsive to the chopper signal, a single-ended signal on an output based on the switched differential voltage across the first and second input chopper stage outputs;
an output stage circuit coupled to the output of the converter stage circuit and configured to generate a single-ended output voltage on a single-ended output of the amplifier circuit based on the signal-ended signal from the converter stage circuit; and
a biasing stage circuit coupled to the input stage circuit and to the output stage circuit, and configured to receive the chopper signal, the biasing stage circuit configured to supply a biasing current to the input and output stage circuits responsive to the chopper signal.

13. The amplifier circuit of claim 12, wherein the input chopper stage circuit is configured to couple the first input to the first chopper stage output and the second input to the second chopper stage output responsive to the chopper signal having a first value, configured to couple the second input to the first chopper stage output and the first input to the second chopper stage output responsive to the chopper signal having a second value.

14. The amplifier circuit of claim 12, wherein the converter stage circuit comprises:
a first biasing node;
a first biasing transistor having a first signal node coupled to the first biasing node, a second signal node coupled to a first internal node, and a control node coupled to the first chopper stage output;
a second biasing transistor having a first signal node coupled to the first biasing node, a second signal node coupled to a second internal node, and a control node coupled to the second chopper stage output;
a current mirror including a first current mirror transistor having signal nodes coupled between the first internal node and a reference node and having a control node, and a second current mirror transistor having signal nodes coupled between the second internal node and the reference node and having a control node coupled to the control node of the first transistor;
a first converter stage chopping circuit having a first input coupled to the first internal node and a second input coupled to the second internal node, and having first and second outputs coupled to the control nodes of the first and second current mirror transistors and having a first output, the converter stage chopping circuit configured to couple the first internal node to the control nodes of the first and second current mirror transistors responsive to the chopping signal having the first value and configured to couple the second internal node to the control nodes of the first and second current mirror transistors responsive to the chopping signal having the second value; and
a second converter stage chopping circuit having a first input coupled to the second internal node and a second input coupled to the first internal node, and having first and second outputs coupled to the output of the converter stage circuit, wherein the second converter stage chopping circuit is configured to couple the second internal node to the output of the converter stage circuit responsive to the chopper signal having a first value and is configured to couple the first internal node to the output of the converter stage circuit responsive to the chopper signal having a second value.

15. The amplifier circuit of claim 14, wherein each of the transistors comprises a MOS transistor.

16. The amplifier circuit of claim 12, wherein the output stage circuit comprises:
a first output transistor having a control node coupled to the output of the converter stage circuit, a first signal node coupled to the single-ended output of the amplifier circuit, and a second signal node coupled to a reference node; and
a second output transistor having a first signal node coupled to the single-ended output of the amplifier circuit, a second signal node coupled to a second biasing node, and a control node configured to receive a first bias voltage biasing stage circuit comprises.

17. The amplifier circuit of claim 16, wherein the biasing stage circuit comprises:
a biasing stage chopper circuit having a first input, a second input, a first output coupled to the first biasing node, and a second output coupled to the second output coupled to the second biasing node, the biasing stage chopper circuit configured to couple the first input to the first output and the second input to the second output responsive to the chopper signal having a first value and configured to couple the second input to the first output and the first input to the second output responsive to the chopper signal having a second value;
a first biasing stage transistor having a first signal node coupled to the first input of the biasing stage chopper circuit, a second signal node coupled to a supply voltage node, and a control node configured to receive a second bias voltage; and
a second biasing stage transistor having a first signal node coupled to the second input of the biasing stage chopper circuit, a second signal node coupled to the supply voltage node, and a control node configured to receive the second bias voltage.

18. The amplifier circuit of claim 12 further comprising at least one gain circuit coupled to the single-ended output of said output stage circuit the at least one gain circuit configured to generate a final single-ended output voltage based on the single-ended output voltage on the single-ended output of the output stage circuit.

19. A method, comprising:
chopping a differential input voltage signal to generate a chopped differential input voltage signal;
generating first and second biasing currents based on the chopped differential input voltage signal, the first and second currents being supplied to first and second internal nodes, respectively;
chopping voltages generated on the first and second internal nodes based on the supplied first and second currents to thereby control a current mirror coupled to the first and second internal nodes;
chopping the voltages on the first and second nodes to generate a single-ended converted signal; and
generating a single-ended output voltage signal based on the single-ended converted signal.

20. The method of claim 19 further comprising generating a chopper signal to control the chopping operations.

* * * * *

UNITED STATES PATENT AND TRADEMARK OFFICE
CERTIFICATE OF CORRECTION

PATENT NO.         : 10,116,267 B2                               Page 1 of 1
APPLICATION NO.    : 15/603004
DATED              : October 30, 2018
INVENTOR(S)        : Stefano Polesel It is certified that error appears in the above-identified patent and that said Letters Patent is hereby corrected as shown below:

In the Claims

<u>Column 10, Line 61, Claim 12:</u>
"signal-ended" should read, --single-ended--.

Signed and Sealed this
Twenty-ninth Day of September, 2020

Andrei Iancu
*Director of the United States Patent and Trademark Office*